United States Patent [19]
Mattfeld et al.

[11] 4,453,135
[45] Jun. 5, 1984

[54] AMPLIFIER CIRCUIT ARRANGEMENT HAVING TWO AMPLIFIERS WITH RESPECTIVELY DIFFERENT ELECTRICAL PROPERTIES

[76] Inventors: Johann Mattfeld, Eschenrain 5, D-7101 Untergruppenbach; Hans-Jürgen Maute, Helfenberger Strasse 3, D-7101 Abstatt, both of Fed. Rep. of Germany

[21] Appl. No.: 398,244

[22] Filed: Jul. 14, 1982

[30] Foreign Application Priority Data

Jul. 15, 1981 [DE] Fed. Rep. of Germany ....... 3127889

[51] Int. Cl.³ .............................................. H03F 3/68
[52] U.S. Cl. .................... 330/295; 330/110; 455/142
[58] Field of Search ................. 330/110, 124 R, 295, 330/307; 455/142

[56] References Cited

U.S. PATENT DOCUMENTS

3,673,507  6/1972  Prescott ............................. 330/295
3,801,922  4/1974  Muszkiewicz ................. 330/295 X Primary Examiner—James B. Mullins
Assistant Examiner—Steven J. Mottola
Attorney, Agent, or Firm—Spencer & Frank

[57] ABSTRACT

Feed-back paths of amplifiers, such as the alternately-operable AM and FM amplifiers of radio receivers, are interconnected by a first capacitor and earthed by a second capcitor, and each of the paths has a switching transistor for permitting current flow through only the feed-back path of the amplifier which is in operation. The AM amplifier has several stages including a final stage with transistors connected via respective feedback paths to two respective input connections. The FM amplifier is identical except that the component values differ.

9 Claims, 2 Drawing Figures

AMPLIFIER CIRCUIT ARRANGEMENT HAVING TWO AMPLIFIERS WITH RESPECTIVELY DIFFERENT ELECTRICAL PROPERTIES

BACKGROUND OF THE INVENTION

The invention relates to a circuit arrangement comprising at least two amplifiers with different electrical properties, one of which is in operation at a time, the amplifier being multi-stage amplifiers having feed-back paths or branches which serve to stablize the DC voltage. The feed-back branches are separated with respect to the DC current by isolation capacitor means and are connected via further capacitor means to a reference potential.

In radio receivers, for example, different amplifiers are required for processing a signal depending on whether there is AM or FM operation. Very different amplifier circuits are required in intermediate frequency amplifiers because of the different types of modulation—amplitude modulation or frequency modulation.

In the case of integrated circuits a common amplifier is frequently used for both types of operation; however, parts of the amplifier circuit are replaced by other parts depending on the type of operation and it is possible that the operating point is switched. This circuit construction has the disadvantage that it is not possible to provide optimum dimensioning because of the dual function of the amplifier. The TDA 1083 circuit produced by AEG-TELEFUNKEN for example contains a common switchable intermediate frequency amplifier for optional AM or FM operation.

It is possible to provide optimum dimensioning of the amplifier circuit if a separate intermediate frequency amplifier is provided for AM and FM operation. This circuit construction has the disadvantage that more connections (pins) are required and the number of components in this circuit as well as the number of components connected externally is greater.

SUMMARY OF THE INVENTION

The present invention seeks to provide a simplified amplifier circuit which can be dimensioned optimally and in which symmetry is ensured and the number of input connections can be reduced considerably as well as the number of externally connected capacitors.

According to a first aspect the present invention provides a circuit arrangement comprising at least first and second multi-stage amplifiers, means for ensuring that only one of said amplifiers is in operation at any time, said amplifiers having different electrical properties and having feed-back paths for stabilizing DC voltage, and isolation capacitor means, said feed-back paths being separated from each other with respect to DC current by said isolation capacitor means, wherein at least one feed-back path of said first amplifier is connected to a feed-back path of said second amplifier, and a common capacitor is provided, said feed-back paths being connected to a reference potential by said common capacitor, means also being provided for permitting current flow only through that one of said feed-back paths which belongs to the amplifier in operation.

In particular the means are preferably electronic switches, with only the switch of the amplifier in operation being closed in each case.

In a preferred embodiment all corresponding feed-back branches of the amplifier are connected together, the feed-back branches being isolated by a capacitor which is common to all of the amplifiers and being connected to reference potential by a further capacitor which is also common to all of the amplifiers. All of the feed-back branches of the amplifiers include electronic switches which are only closed in the amplifier which is in operation. The electronic switches preferably comprise switching transistors, their emitter collector paths being connected in the feed-back branches. When the operating voltage is applied to the amplifier provided for operation the switching transistors contained in the amplifier are fed with a base potential driving these transistors.

BRIEF DESCRIPTION OF THE DRAWINGS

A preferred embodiment of the present invention will now be described, by way of example only, with reference to the accompanying drawings, of which.

DESCRIPTION OF THE PREFERRED EMBODIMENT

Figure 1:
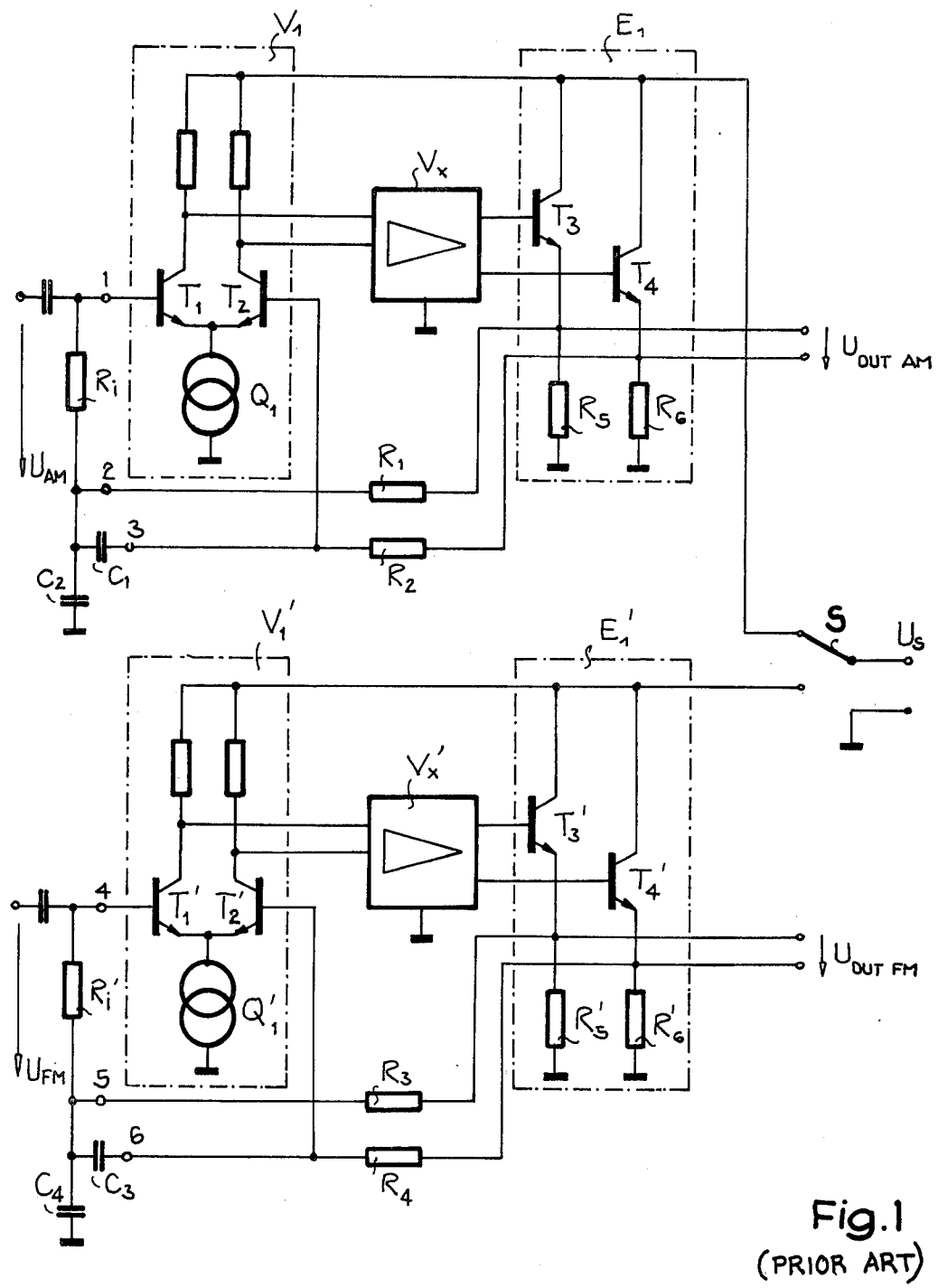
FIG. 1 shows a prior art circuit arrangement.

Referring firstly to FIG. 1 there is shown a circuit arrangement having two amplifiers for different frequencies with a total of 6 input connections and 4 capacitors. The upper amplifier arrangement as shown in the diagram may serve to amplify the intermediate frequency of the amplitude modulated signal, for example, whereas the lower amplifier serves to amplify the frequency modulated signal. Both amplifiers comprise a number of amplifier stages $V_1$ to $V_x$ which are constructed like a differential amplifier for example. Each stage includes two transistors $T_1$ and $T_2$ which are connected together at the emitter electrodes and are supplied with a constant current via a current source $Q_1$. The input signal is supplied to the base electrode of the two transistors $T_1$ and $T_2$ via the input connections 1 and 2. At the collectors of the two transistors the output signal of the first amplifier $V_1$ is supplied to the subsequent amplifier stages $V_x$. The final stage $E_1$ comprises two final stage transistors $T_3$ and $T_4$, the base electrodes of which are supplied with the output signal of the last amplifier stage $V_x$. The amplified amplitude of modulated output signal $U_{OUT}$ AM is tapped at the emitter resistors $R_5$ and $R_6$ of the final stage transistor $T_3$ and $T_4$.

Feed-back branches are provided for stabilizing the DC voltage and connect the emitter of transistor $T_3$ via the resistor $R_1$ to the base electrode of the transistor $T_1$ of the first amplifier stage and the emitter electrode of the transistor $T_4$ via the resistor $R_2$ to the base electrode of the transistor $T_2$ of this first amplifier stage $V_1$. The first feed-back branch with the resistor $R_1$ is linked to the base electrode of transistor $T_1$ via the internal resistance $R_i$ of the generator in the input circuit. The two feed-back branches having the resistors $R_1$ and $R_2$ are isolated with respect to DC current by a capacitor $C_1$. Furthermore, both feed-back branches are connected to earth potential via the capacitor $C_2$. Since the capacitors $C_1$ and $C_2$ are connected externally to the integrated semi-conductor circuit, the said circuit has the input connections 1, 2 and 3, the pins 2 and 3 forming connections with the feed-back branches having the resistors $R_1$ and $R_2$.

The intermediate frequency amplifier circuit for FM operation is basically identical in construction to the amplifier circuit for AM operation. Of course the components are of different dimensions or values and the operating points are adjusted appropriately to FM operation. The FM amplifier circuit also includes two feed-back branches having resistors $R_3$ and $R_4$ which lead to the connection pins 5 and 6. The connection pins 5 and 6 are connected via the isolation capacitor $C_3$ whereas the connection pin 5 is also connected to earth potential via the capacitor $C_4$.

During operation of the circuit either the AM amplifier or the FM amplifier is applied to the operating potential $U_S$ via the switch S. The entire circuit therefore includes 4 capacitors $C_1$, $C_2$, $C_3$ and $C_4$ and requires 6 input connections 1–6.

The circuit shown in FIG. 1 could for example be simplified by linking points 2 and 5 and by connecting them to reference potential via a capacitor which is then common to both points. However, this would result in an undesirable lack of symmetry of the circuit, since in operation the amplifier would in each case be subject to the feed-back resistance in the disconnected amplifier.

Figure 2:
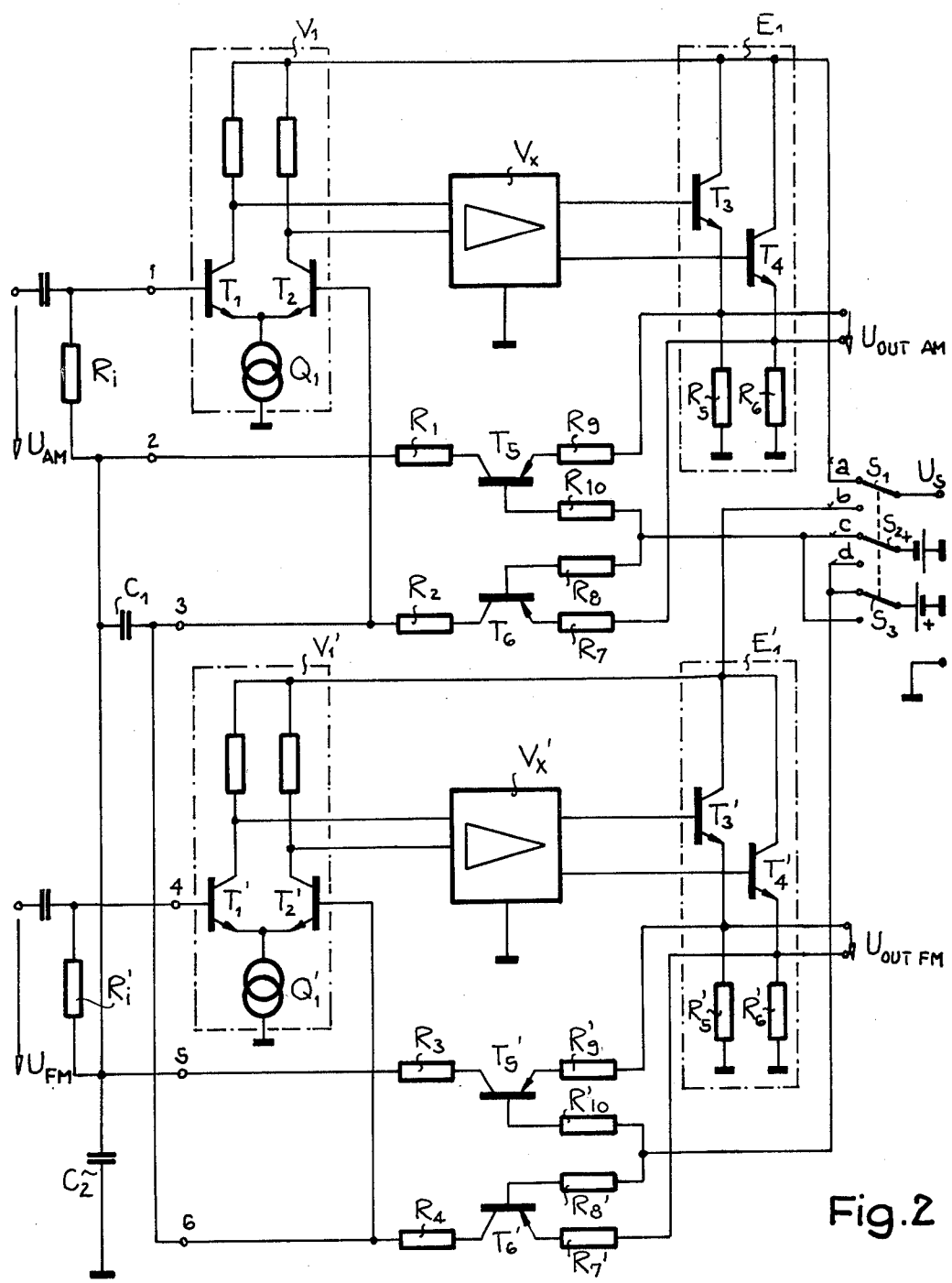
FIG. 2 shows a circuit arrangement in accordance with the present invention.

Referring now to FIG. 2 there is shown a circuit arrangement in accordance with the invention comprising an AM amplifier and an FM amplifier. Apart from the arrangement of the feed-back branches and the input connections the circuit corresponds to the circuit of FIG. 1. Both amplifiers comprise a number of amplifier stages $V_{1'}$ to $V_{x'}$ or $V_1$ to $V_x$ and final stages $E_1$ or $E_{1'}$. In the amplifier for the amplitude modulated signal $U_{AM}$ a first feed-back branch leads from the emitter electrode of the final stage transistor $T_3$ to the connection point 2 and a second feed-back branch reads from the emitter electrode of the output transistor $T_4$ to the output connection 3. Two suitably constructed feed-back branches also form part of the amplifier for the frequency modulated signal $U_{FM}$. These feed-back branches lead to the connection points 5 and 6 but coincide with the connection points 2 and 3 so that only the connection points 1, 2, 3 and 4 have to be guided out through the IC. Each feed-back branch includes a feed-back resistor $R_1$, $R_2$, $R_3$ or $R_4$ and the collector emitter path of a switching transistor $T_5$ $T_6$ $T_{5'}$ or $T_{6'}$ which is connected in the series therewith. As shown in FIG. 2 an isolation resistor $R_7$, $R_9$, $R_{7'}$ or $R_{9'}$ respectively can be located in the emitter branch of the switching transistors and is connected to a respective connection point at the corresponding final stage transistor. The base electrodes of the switching transistors $T_5$ and $T_6$ which are arranged in the feed-back branches of the AM amplifier are connected via isolation resistors $R_8$ and $R_{10}$ and are supplied to a potential connection c. Correspondingly, in the case of the FM amplifier the base electrodes of the switching resistors $T_{5'}$ and $T_{6'}$ are linked via isolation resistors $R_{8'}$, $R_{10'}$ and connected to a potential connection d.

The input connections 3 and 6 in corresponding feed-back branches of the two amplifier circuits are interconnected in accordance with FIG. 2 and are separated with respect to DC current from the connection points 2 and 5, which are also interconnected, by an isolation capacitor $C_1$. The common connection point 2 and 5 is connected to reference potential by a further capacitor $C_2$. Capacitors $C_1$ and $C_2$ ensure that negative feed-back is prevented. In the circuit of FIG. 2, internal resistances of the generator of the input circuits for the intermediate frequency amplifiers are designated $R_i$ or $R_{i'}$ respectively. If the AM amplifier circuit is set in operation by applying the supply voltage $U_S$ via the connection point a then a base potential driving the switching transistors is supplied at the same time to the base electrodes of the switching transistors $T_5$ and $T_6$ in the feed-back branches of this AM amplifier circuit via the connection point c. Since, in the embodiment shown, the transistors $T_5$ and $T_6$ are PNP Bipolar transistors, the potential at the point c has to be negative with respect to the potential at the emitter electrodes of the final stage transistors $T_3$ and $T_4$. In order that the transistors $T_5$ and $T_6$ in the FM amplifier are safely switched off, a base potential which is positive as compared to the potential prevailing at the final stage transistors $T_3$ and $T_4$ is supplied at the same time to the base electrodes of these transistors $T_5$ and $T_6$ via the connection point d.

During operation of the FM amplifier the potential ratios just described are exchanged. Adjustment of the said potentials is symbolised in FIG. 2 by the switches $S_1, S_2$ and $S_3$. However, it should also be pointed out that the switching voltages for the transistors are preferably obtained internally in the feed-back branches from the supply voltage, for example via a band-gap reference circuit.

An integrated semi-conductor circuit containing both the AM amplifier and the FM amplifier has only four input connections 1–4, the two externally connected capacitors $C_1$ and $C_2$ being connected thereto. The capacitors $C_1$ and $C_2$ have a value of approximately 100 nF in a preferred example while the feed-back resistors $R_1$ to $R_4$ have a value of 20 k$\Omega$ for example.

Thus the number of input connections is reduced from six to four by the circuit arrangement in accordance with the invention compared to amplifiers such as those shown in FIG. 1. The number of externally connected capacitors is halved from four to two.

It will be understood that the above descripton of the present invention is susceptible to various modifications, changes and adaptations.

What is claimed is:

1. A circuit arrangement comprising at least first and second multi-stage amplifiers, means for ensuring that only one of said amplifiers is in operation at any time, said amplifiers having different electrical properties and having feed-back paths for stabilizing DC voltage, and isolation capacitor means, said feed-back paths being separated from each other with respect to DC current by said isolation capacitor means, wherein at least one feed-back path of said first amplifier is connected to a feed-back path of said second amplifier, and a common capacitor is provided, said feed-back paths being connected to a reference potential by said common capacitor, means also being provided for permitting current flow only through that one of said feed-back paths which belongs to the amplifier in operation.

2. An arrangement as claimed in claim 1, said amplifiers having similar circuit constructions, apart from the values of their components, and said feed-back paths constituting corresponding parts of the respective amplifiers.

3. A circuit arrangement as claimed in claim 1, said current flow permitting means comprising an electronic switch arranged in each of said feed-back paths, only the switch which is in the amplifier which is in operation being closed.

4. A circuit arrangement as defined in claim 3, each electronic switch comprising switching transistors having emitter-collector paths, said emitter-collector paths being connected in said feed-back paths, and means being provided for applying a base potential to operate said switching transistors in a said amplifier when an operating voltage is applied to said amplifier.

5. A circuit arrangement as defined in claim 4, isolation resistors being connected to the base electrodes of said switching transistors.

6. A circuit arrangement as defined in claim 1, all of the corresponding feed-back paths of the amplifiers being connected to one another, said feed-back paths being isolated in relation to each other by a capacitor means common to all of said amplifiers, said feed-back paths being connected to a reference potential via a further capacitor also common to all of said amplifiers; and all of said feed-back paths of said amplifiers having electronic switches which are only closed in the amplifier which is in operation.

7. A circuit arrangement as defined in claim 1 said amplifiers each comprising, a plurality of differential amplifier stages and a final stage with two final stage transistors, the first said differential stage comprising two transistors a feed-back path leading from each said final stage transistor to the base electrode of a respective said transistor in said first differential stage, said two feed-back paths being isolated from each other with respect to DC current by a capacitor and being connected to a reference potential via a further capacitor, said capacitors being simultaneously associated with the other amplifiers with respect to which they have the same function.

8. A circuit arrangement as defined in claim 1 comprising an integrated semi-conductor circuit to which said capacitors are connected externally.

9. A radio receiver comprising a circuit arrangement, said circuit arrangement comprising at least first and second multi-stage amplifiers, means for ensuring that only one of said amplifiers is in operation at any time, said amplifiers having different electrical properties and having feed-back paths for stabilizing DC voltage, and isolation capacitor means, said feed-back paths being separated from each other with respect to DC current by said isolation capacitor means, wherein at least one feed-back path of said first amplifier is connected to a feed-back path of said second amplifier, and a common capacitor is provided, said feed-back being connected to a reference potential by said common capacitor, means also being provided for permitting current flow only through that one of said feed-back paths which belongs to the amplifier in operation, wherein said first and second amplifiers are switchable intermediate frequency amplifiers for AM and FM operation, respectively.

* * * * *